(12) United States Patent
Ma

(10) Patent No.: US 6,540,541 B2
(45) Date of Patent: Apr. 1, 2003

(54) ZIF SOCKET ASSEMBLY HAVING PROTECTOR PLACED ON CHIP MOUNTED ON THE SOCKET ASSEMBLY

(75) Inventor: Hao-Yun Ma, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/909,511

(22) Filed: Jul. 20, 2001

(65) Prior Publication Data

US 2003/0017736 A1 Jan. 23, 2003

(30) Foreign Application Priority Data

Jun. 29, 2001 (TW) ........................ 90210905 U

(51) Int. Cl.[7] ................................................ H01R 4/50
(52) U.S. Cl. ..................................................... 439/342
(58) Field of Search ................................ 439/331, 342, 439/259–270, 70–73; 361/704, 756, 752, 386

(56) References Cited

U.S. PATENT DOCUMENTS

| 3,831,131 | A | * | 8/1974 | Woodcock et al. | ......... 439/331 |
| 4,427,249 | A | * | 1/1984 | Bright et al. | .................. 439/68 |
| 4,679,118 | A | * | 7/1987 | Johnson et al. | ............. 361/386 |
| 5,295,043 | A | * | 3/1994 | Beijer | ........................ 361/704 |

* cited by examiner

Primary Examiner—Lynn Field
Assistant Examiner—Son V. Nguyen
(74) Attorney, Agent, or Firm—Wei Te Chung

(57) ABSTRACT

A ZIF socket assembly used with a chip (6) comprises a ZIF socket (5), an external actuating tool (8) and a protector (7). The socket comprises a base (51) and a sliding cover (53). The base comprises a recess (514) on an end thereof. The sliding cover is movably assembled on the base for receiving the chip and comprises a slot (514) in alignment with the recess. The protector is placed upon the chip and comprises a number of legs (71) extendingdownwardly for pressing against the chip and a rib (72) projecting downwardly from a bottom face thereof for heightening the protector with respect to the chip. The actuating tool is inserted into the recess through the slot and drives the cover, the chipand the protector to move with respect to the base, thereby achieving an electrical connection between the chip and the socket.

3 Claims, 5 Drawing Sheets

ZIF SOCKET ASSEMBLY HAVING PROTECTOR PLACED ON CHIP MOUNTED ON THE SOCKET ASSEMBLY

BACKGROUND OF THE INVENTION

1. Field of the Invention

The present invention relates to a ZIF socket assembly, and particularly to a ZIF socket assembly which can move a sliding cover on a base with an actuating tool.

2. Description of Related Art

ZIF socket is widely used for connecting an integrated circuit chip with a printed circuit board. A conventional ZIF socket includes a base, a sliding cover movably assembled on the base and a cam lever rotatably sandwiched between the base and the sliding cover. The cam is rotated by manipulation and carries the sliding cover to move on the base thereby achieving a ZIF purpose. Recently, for consideration of the miniaturization of all kinds of appliances, particularly of the portable computer, the ZIF socket had to reduce its size or height. The conventional ZIF socket carried by cam lever, which is disclosed by U.S. Pat. No. 5,057,031, cannot meet the trend of miniaturization. U.S. Pat. No. 5,730,615 discloses a low-profile ZIF socket of which a sliding cover is carried by an actuating tool and moves on a base. However, for achieving effective movement of an integrated circuit chip, the actuating tool will press against the integrated circuit chip directly and thus damage the integrated circuit chip. Therefore, in general manipulation, a protector is provided upon the integrated circuit chip for preventing the integrated circuit chip from being subjected to force directly.

Referring to FIGS. 4 and 5, a ZIF socket assembly for connecting an integrated circuit chip 2 with a mating printed circuit board comprises a ZIF socket 1 and a protector 3. The ZIF socket 1 comprises a base 10 and a sliding cover 11 movably assembled on the base 10. The base 10 comprises a recess 101 at an end thereof. The sliding cover 11 defines a slot 111 in vertical alignment with the recess 101 of the base 10. The integrated circuit chip 2 is mounted on the sliding cover 11. The protector 3 is placed upon the integrated circuit chip 2 and comprises a plurality of legs 31 extending downwardly from each edge thereof and pressing against the integrated circuit chip 2. Referring to FIG. 5, in manipulation, an actuating tool 4 is inserted into the recess 101 through the slot 111 and rotated to carry the sliding cover 11 and the integrated circuit chip 2 to move with respect to the base 10 thereby achieving an electrical connection between pins 20 of the chip 3 and terminals 100 of the socket 1.

However, in general, the protector 3 is made of metal, so the leg 31 of protector 3 has a punched arc flexure 310 and a straight arm 311 extending downwardly from the flexure 310. The conventional protector 3 is closely attached to an upper face of the chip 2, so the flexure 310 presses against the chip 2. Since the dimension of the flexure 310 is difficult to control, the flexure 310 may be slightly larger than the chip 2. Moreover, understandably the arc flexure 310 owns a minimum radius which precludes the side edge of the chip from abutting against the straight arm 311. A little clearance t will exit between the chip 2 and the legs 31 of the protector 3, so the stroke of the protector 3 may be waste or the protector 3 may fail.

Hence, an improved protector arrangement is required to overcome the disadvantages of the conventional ZIF socket assembly.

SUMMARY OF THE INVENTION

Accordingly, the object of the present invention is to provide a ZIF socket assembly with an improved protector which can disperse a force pressing on a chip when chip is carried to move with respect to a base of the socket.

In order to achieve the object set forth, a ZIF socket assembly for use with an integrated circuit chip comprises a socket, a protector. The socket comprises a base, a plurality of terminals and a sliding cover. The base comprises a plurality of receiving passageways for receiving corresponding terminals and a lower flange extending outwardly from an end thereof. The lower flange defines a recess on an upper face thereof. The sliding cover is movably assembled on the base for receiving the chip and comprises a plurality of through holes in vertical alignment with corresponding receiving passageways. An upper flange extends outwardly from an end of the cover and defines a slot in vertical alignment with the recess of the base. The protector is placed upon the chip and comprises a plurality of the legs extending downwardly for contacting with edges of the chip. A contact portion extends upwardly from an end thereof for dispersing a force exerting on the chip by the protector. When the cover, the chip and the protector is carried to move with respect to the base, an electrical connection between the socket and the chip is achieved.

Other objects, advantages and novel features of the invention will become more apparent from the following detailed description when taken in conjunction with the accompanying drawings.

DETAILED DESCRIPTION OF THE INVENTION

Figure 1:
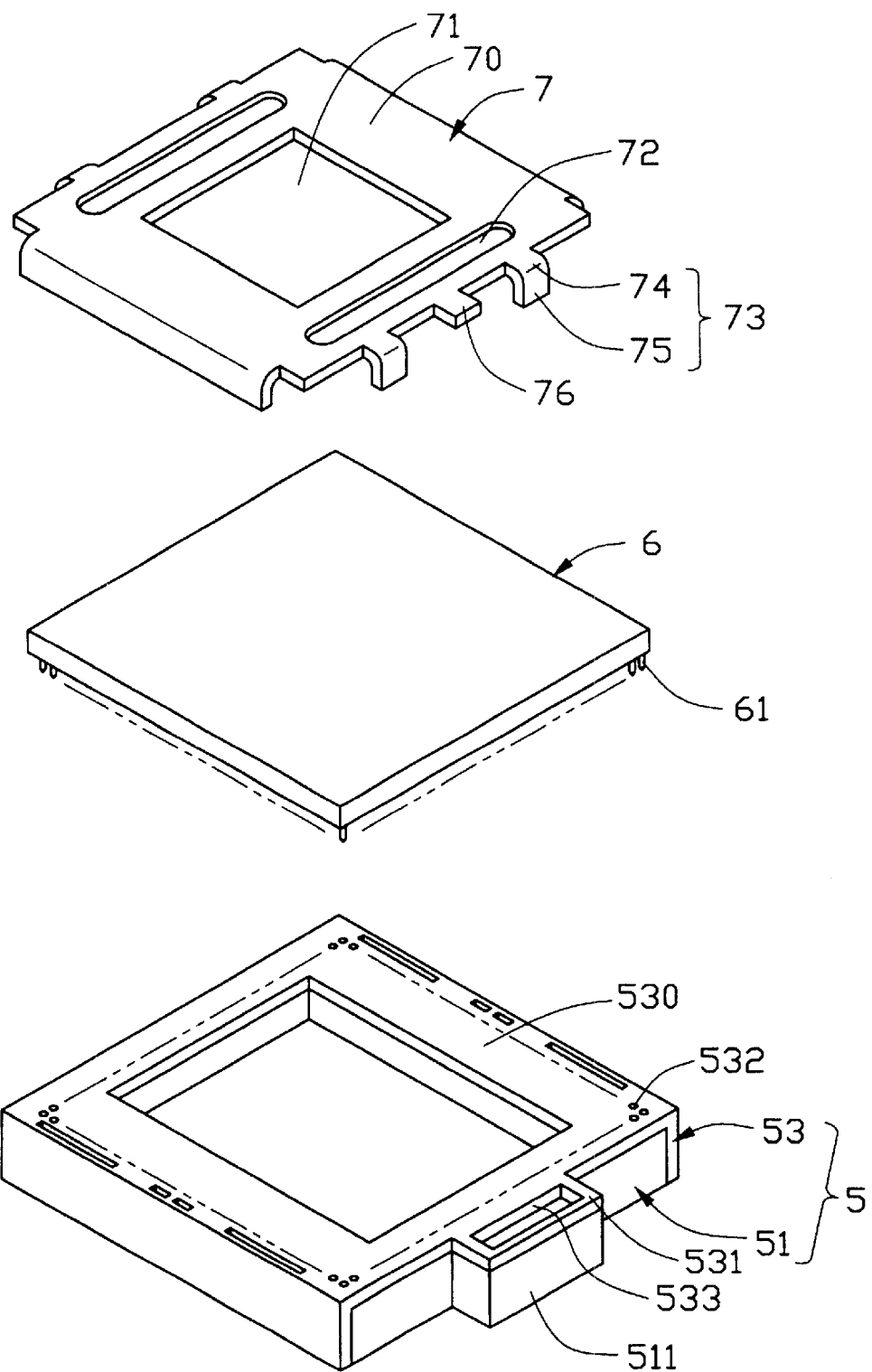
FIG. 1 is a perspective exploded view of a ZIF socket assembly with a protector of the present invention.

Reference will now be made to the drawing FIGS. to describe the present invention in detail.

Figure 3:
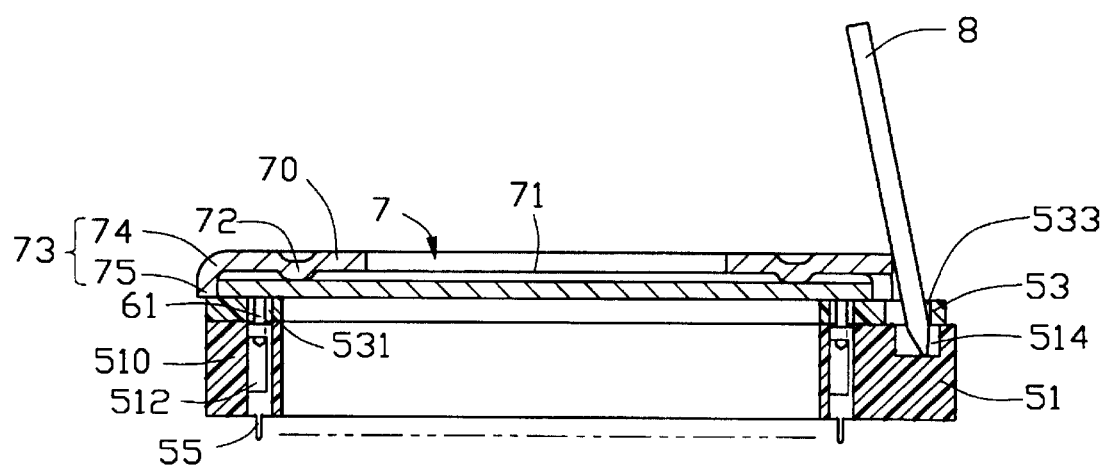
FIG. 3 is a crossing-sectional view of the ZIF socket assembly when an actuating tool is driving the protector, a chip and a sliding cover of the socket to move with respect to a base of the socket.
Figure 4:
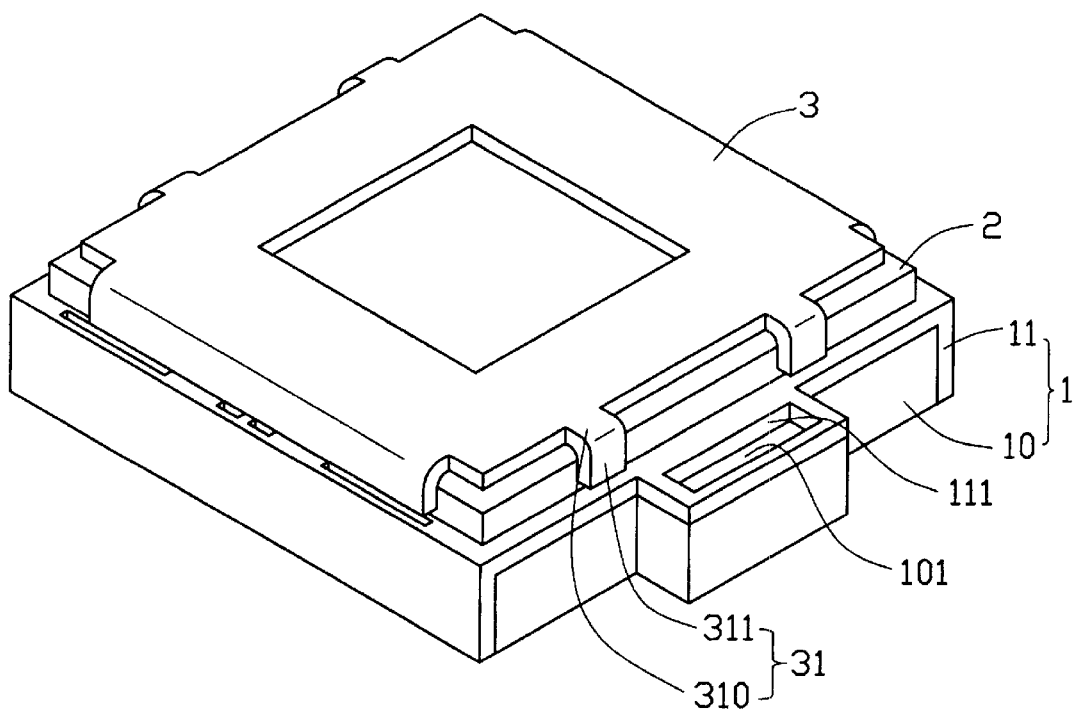
FIG. 4 is a perspective assembled view of a conventional ZIF socket assembly with a protector.
Figure 5:
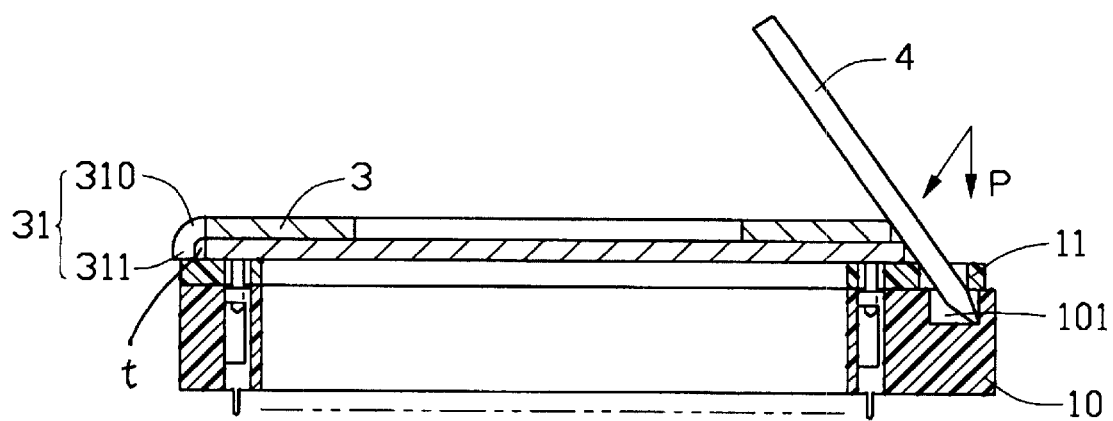
FIG. 5 is a crossing-sectional view of the ZIF socket assembly when an actuating tool is driving the protector, a chip and a sliding cover of the socket to move with respect to a base of the socket.

Referring to FIGS. 1 and 3, a ZIF socket assembly comprises a ZIF socket 5, an actuating tool 8 and a protector 7. The ZIF socket 5 comprises a base 51, a sliding cover 53 movably assembled on the base 51 and a plurality of terminals 55 received in the base 51.

The base 51 comprises a lower rectangular member 510 and a lower flange 511 extending outwardly from an end of the lower rectangular member 510. The lower rectangular member 510 defines a plurality of spaced apart receiving passageways 512 extending vertically through the base 51 for receiving corresponding terminals 55. The lower flange 511 defines a recess 514 on an upper face thereof for receiving actuating tool 8.

The sliding cover 53 comprises an upper rectangular member 530 and an upper flange 531 extending outwardly from an end of the upper rectangular member 530. The upper rectangular member 530 defines a plurality of through holes 531 in alignment with corresponding receiving passageways 512 of the base 51 for receiving corresponding pins 61 of a mating integrated circuit chip 6. The upper flange 531 defines a rectangular slot 533 in vertical alignment with the recess 514 of the base 51.

The protector 7 is assembled on the chip 6 and comprises a rectangular member 70 and a plurality of legs 73 extending downwardly from each edge of the rectangular member 70. The rectangular member 70 defines a square opening 71 in the middle thereof. The leg 73 comprises an arcuate flexure 74 and a straight arm 75 extending downwardly from a bottom of the flexure 74. A pair of parallel ribs 72 extends downwardly from a lower face for pressing against an upper face of the chip 6. The protector 7 further comprises a contacting portion 76 extending outwardly from the rectangular member 70

Figure 2:
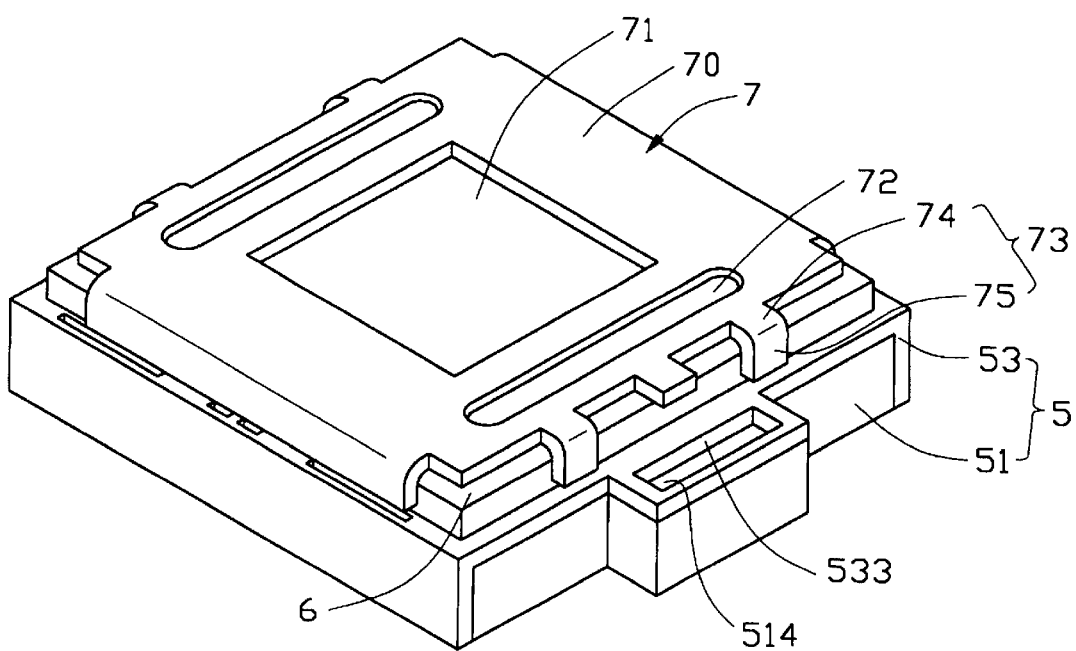
FIG. 2 is a perspective view of the assembled ZIF socket assembly.

In assembly, referring to FIGS. 2 and 3, the terminals 55 are placed in the receiving passageways 512 of the base 51 and the sliding cover 53 is movably assembled on the base 51 with the through holes 532 in vertical alignment with corresponding receiving passageways 512. The chip 6 is then placed on the sliding cover 53 with the pins 61 received in corresponding receiving passageways 512 through corresponding through holes 532. The protector 7 is finally placed on the chip 6 with the straight arms 75 of the legs 73 pressing against edges of the chip 6 and the ribs 72 pressing against the upper face of the chip 6. In manipulation, the actuating tool 8 is inserted into the recess 514 of the base 51 through the slot 533 of the sliding cover 53. Successively, the actuating tool 8 is rotated and presses against the contacting portion 76 of the protector 7 thereby carrying the sliding cover 53, the protector 7 and the integrated circuit chip 6 to move with respect to the base 5I. Therefore, an electrical connection between the pins 61 of the chip 6 and the terminals 55 of the socket 5 is achieved.

Since the downward extending ribs 72 of the protector 7 presses against the upper face of the chip 6 directly, the protector 7 is heightened thereby the straight arm 75 pressing against the chip 6 directly. In manufacturing, the dimension of the straight arm 75 is easy to control; so the straight arm 75 may achieve a close cooperation with the chip 6. Therefore, the stroke of the protector 7 is reduced and such avoids the failure of the protector.

It is noted that from another viewpoint, because of the ribs 72 which efficiently raises the rectangular member 70 relatively significantly above the chip 6, the arcuate flexure 74 no longer directly confronts the corresponding side edge of the chip 6, thus allowing close/tight engagement between the straight arm 75 and that corresponding side edge of the chip 6 without any improper clearance/gap therebetween. Moreover, because the rectangular member 70 is raised up, there is less possibility for the tool 8 to touch the side edge of the chip during rotation structurally. In other words, the contacting portion 76 may be deemed as an optional/optimal element under this situation. In opposite, only if the rectangular member 70 is too closer to the chip 6 or even no ribs thereof, the contacting portion 76 is required to preferably extend laterally beyond the leg 73 for efficiently constant engagement with the tool 8 for precluding possibility of engagement between the tool 8 and the side edge of the chip 6.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A ZIF socket assembly for use with an integrated circuit chip with a plurality of pins, comprising:
    a ZIF socket comprising:
        a base comprising a plurality of receiving passageways and a recess at an end portion thereof;
        a plurality of terminals received in the passageways; and
        a sliding cover being movably assembled on the base for receiving the chip and comprising a plurality of through holes in vertical alignment with corresponding receiving passageways for receiving corresponding pins of the chip and a slot in vertical alignment with the recess of the base for inserting an external actuating tool; and
    a protector being placed upon the chip, the protector comprising a rectangular member, a plurality of legs and at least one rib, each leg comprising a horizontal flexure extending outwardly form an edge of the rectangular member and a vertical straight arm integrally extending downwardly from a bottom of the flexure for engaging with the integrated circuit chip, the at least one rib projecting downwardly from a bottom face of the rectangular member for rising the protector with respect to the chip; wherein
        the protector comprises a contacting portion extending outwardly from the edge of the rectangular member and parallel to the horizontal flexure and being adapted to be abut against by the actuating tool; wherein
        the rectangular member is raised up to be relatively significantly spaced from the chip so as to allow the straight arms of the legs to be closely engaged with corresponding side edges of the chip without any improper gap therebetween.

2. The ZIF socket assembly as described in claim 1 further comprising the external actuating tool insertable into the recess through the slot to drivingly move the sliding cover and the chip with respect to the base.

3. The ZIF socket assembly as described in claim 1, wherein the rectangular member of the protector defines a rectangular opening in a middle thereof.

* * * * *